United States Patent [19]
Yaniv et al.

[11] Patent Number: 4,868,664
[45] Date of Patent: * Sep. 19, 1989

[54] CONTACT TYPE IMAGE REPLICATION EMPLOYING A LIGHT PIPING FACEPLATE

[75] Inventors: Zvi Yaniv, Farmington Hills; Vincent D. Cannella, Birmingham; John McGill, Lake Orion, all of Mich.

[73] Assignee: Energy Conversion Devices, Inc., Troy, Mich.

[*] Notice: The portion of the term of this patent subsequent to Oct. 11, 2005 has been disclaimed.

[21] Appl. No.: 208,947

[22] Filed: Jun. 20, 1988

Related U.S. Application Data

[63] Continuation-in-part of Ser. No. 111,233, Oct. 22, 1987, Pat. No. 4,777,534, which is a continuation-in-part of Ser. No. 912,447, Sep. 29, 1986, Pat. No. 4,691,244, which is a continuation-in-part of Ser. No. 607,153, May 4, 1984, Pat. No. 4,660,095.

[51] Int. Cl.$^4$ .............................................. H04N 3/14
[52] U.S. Cl. .................................. 358/213.13; 358/471
[58] Field of Search ................... 358/213.13, 225, 294

[56] References Cited

U.S. PATENT DOCUMENTS

| | | | |
|---|---|---|---|
| 3,603,731 | 9/1971 | Weimer | 358/213.29 |
| 3,696,250 | 10/1972 | Weimer | 358/213.22 |
| 4,149,197 | 4/1979 | Kos et al. | 358/294 |
| 4,226,898 | 10/1980 | Ovshinsky et al. | 357/2 |
| 4,482,804 | 11/1984 | Oritsuki et al. | 358/294 |

Primary Examiner—Jin F. Ng
Assistant Examiner—Stephen Brinich
Attorney, Agent, or Firm—Marvin S. Siskind; Richard M. Goldman

[57] ABSTRACT

Apparatus for the photogeneration of electrical signals representative of a detectable condition of an image-bearing surface. The apparatus includes a transparent substrate upon which an array of spaced, thin film photosensitive elements is deposited. A substantially loss-free, light transmitting faceplate, preferably formed from a fused array of oriented optical fibers is operatively spaced from that array of photosensitive elements by a layer of optical grease.

24 Claims, 3 Drawing Sheets

CONTACT TYPE IMAGE REPLICATION EMPLOYING A LIGHT PIPING FACEPLATE

CROSS-REFERENCE TO RELATED APPLICATIONS

This patent application is a continuation-in-part application of commonly assigned U.S. patent application Ser. No. 11, 233 filed Oct. 22, 1987, now U.S. Pat. No. 4,777,534, which is a continuation-in-part application of Ser. No. 912,447 filed 9-29-86 commonly assigned U.S. Pat. No. 4,691,244 issued Sept. 1, 1987, which is a continuation-in-part of Ser. No. 607,153 filed 5-4-84 U.S. Pat. No. 4,660,095 issued Apr. 21, 1987.

FIELD OF THE INVENTION

The present invention relates generally to apparatus adapted to photogenerate electrical signals representative of the detectable condition of an image bearing surface. The present invention more particularly relates to apparatus adapted to photogenerate electrical signals representative of a detectable condition of an image bearing surface such as a printed document by sensing the difference in intensity of radiation from the high and low optical density portions thereof. In its most specific form, the instant invention relates to a fiber optic faceplate formed from an oriented, fused array of minute optical fibers capable of transmitting radiation from small area portions of an optically detectable image (disposed closely proximate the light incident face of the faceplate) to corresponding small area, thin film photosensitive elements (upon which the fiber optic faceplate is seated) without substantial transmission loss; said photosensitive elements adapted to photogenerate electrical signals corresponding to the integrated amount of transmitted radiation.

BACKGROUND OF THE INVENTION

Systems for converting an image or other optically detectable surface condition, such as characters on a document, into electrical signals which can either be stored in memory for later recall or which can be transmitted to a remote location over, for example, telephone communication lines or similar apparatus, are well know in the reproduction art. Systems of this type have generally been referred to as image scanners. In one type of image scanner, the image bearing document is held stationary and a photosensitive element or an array of photosensitive elements, along with a localized source of illumination, is successively scanned across each line of the document. In another type of image scanner, the array of photosensitive elements and the light source are held stationary and the image bearing document is moved therepast. In both types of image scanning systems, as the image-bearing document is scanned, the high optical density or dark portions of the document reflect less light from the light source for reception by the photosensitive elements than the low optical density or light portions. As a result, the high and low optical density portions can be contrasted by the photosensitive elements for photogenerating electrical signals representative of the image on, or other surface characteristic of, the image of the image-bearing document.

While image scanning systems of the type described in the previous paragraph have proven generally successful in fulfilling their intended purposes and have gained commercial acceptability, prior to the invention disclosed in the parent of this application, such optical image scanning systems have exhibited several deficiencies. One major deficiency heretofore encountered in image scanning systems of this type has been the need to employ either an optical array of lenses to focus the light from the image bearing surface onto the array of photosensitive elements, or to locate the image bearing surface in extremely close relationship to the array of photosensitive elements, which elements are then adapted to scan the image on that surface. This close relationship between the image on the image bearing surface and the photosensitive elements was required in order to facilitate the "proximate focusing" of light from a small area portion of the image on the image-bearing surface onto a corresponding small area photosensitive element of the array. This close relationship was necessary because of the fact that light quickly diffuses. Due to that diffusion if the photosensitive elements were not located in close proximity to said small area portions of the image upon the image bearing surface, light emanating from one small area portion thereof would diffuse onto photosensitive elements not corresponding to said small area portion. The result would be the photogeneration of false signals by said small area photosensitive elements, which false signals could result in a replicated image of poor resolution and unacceptable quality.

Heretofore, this necessity for maintaining a close physical relationship between the plane of said array of photosensitive elements and the plane of said image bearing surface could only be satisfied by having said photosensitive elements, and any abrasion resistant, overcoat layer disposed thereupon, actually contact and slide across the image bearing surface. The relative motion between the image bearing surface and the array of photosensitive elements resulted in a second deficiency of prior art image scanning systems; i.e., said deficiency being the build-up of a large static charge on the image bearing surface. Therefore, such prior art systems required that precautions be taken to prevent the static charge built-up on said image bearing surface from inducing an electrical charge in the spacedly positioned array of photosensitive elements, which induced charge (of up to 600 volts) would be capable of deleteriously affecting, and possibly fatally damaging, said photosensitive elements. Previous attempts to solve this problem had focused upon the use of a static shielding operatively layer interposed between the image bearing surface and the array of photosensitive elements. While this approach has proven successful in eliminating the deleterious effects of the build-up of static charge, it has also served to lengthen the distance between the image bearing surface and the array of photosensitive elements, thereby reducing the quality and resolution of the image being photogenerated by the photosensitive elements. The fabrication of the image scanning system with static shielding layer further necessitated additional costs and induced additional fabrication constraints.

In the parent of instant patent application, solutions to the problem of maintaining said photosensitive elements in close proximity to said image bearing surface and solutions to the problem of static build-up were provided. With respect to the question of static build-up, the fiber optic faceplate provided a relatively thick dielectric material between the array of photosensitive elements and the image-bearing surface. Since the faceplate is relatively thick and fabricated of a dielectric material, it provided sufficient electrical isolation between the array and the static electrical charge built up on the image bearing surface being scanned that said static charge was unable to harm the spacedly positioned array of photosensitive elements.

Additionally, the fiber optic faceplate transmits radiation emanating from small area portions of the image on said image bearing document to corresponding small area photosensitive elements with such high resolution and efficiency so as to effectively approximate the presence of a zero thickness window between the image bearing surface and the array of photosensitive elements. Therefore, it was only necessary that the light piping faceplate was placed in sufficient proximity to the image bearing surface to accurately transmit radiation from said small area portions of that surface. Because small area portions of the light piping faceplate receive radiation from only corresponding small area portions of the image on said image-bearing substrate and said faceplate is capable of transmitting radiation incident thereupon virtually without loss to corresponding small area photosensitive elements, it was no longer necessary that said array of photosensitive elements be operatively disposed in such close proximity to said image bearing surface.

While the parent of the instant patent application successfully employed a fiber optic faceplate, in the embodiment disclosed therein, the layers of amorphous silicon alloy material from which the array of photosensitive elements was fabricated, were deposited directly upon the light receiving surface of that faceplate. This was a significant step forward in the art because the loss of light transmitted between the photosensitive elements and the image-bearing surface was thereby minimized. However, a problem arose when the inventors of the parent application sought to employ such an image scanning system to scan image bearing surfaces of large dimensions. The problem arose because the company manufacturing the optical fiber faceplate could only manufacture those faceplates in lengths up to six inches, while normal letterhead and computer paper required at least eight inch acceptability. Therefore, it became necessary to employ an alternate fabrication scheme in order to obtain the advantages enumerated hereinabove with respect to the use of the faceplate. It is to the end of modifying the image scanning scheme disclosed in the parent of the instant application to which this invention is directed.

These and other objects and advantages of the subject invention will become apparent from the perusal of the Detailed Description Of The Invention, the Drawings and the Claims which follow hereinafter.

BRIEF SUMMARY OF THE INVENTION

The subject invention provides a new and improved image scanning apparatus, said apparatus adapted to photogenerate electrical signals representative of a small area portion of an image on an image bearing surface, which image is projected, substantially without loss, onto an associated array of small area photosensitive elements. In accordance with one preferred embodiment of the invention, there is provided a contact type document image scanner which is adapted to electronically scan said document or other image bearing surface disposed in relatively close proximity to the light incident face of a novel light piping faceplate.

The present invention therefore provides an apparatus adapted to photogenerate electrical signals representative of an image on an image bearing surface, which apparatus includes an array of spacedly disposed, continuous, small area, photosensitive elements formed from deposited, thin film semiconductor alloy material. Each of these small area photosensitive elements is capable of effecting a detectable electrical signal responsive to the intensity of light incident thereupon and emanating from a corresponding small area portion of the image on the image bearing surface. The array is deposited on a (transparent) substrate and preferably includes at least one column of said photosensitive elements operatively disposed so as to cover at least a linear portion of at least one dimension of the image bearing surface. Atop each of the photosensitive elements in the array there is deposited an electrode formed as a layer of transparent electrically conductive material, which electrode is fabricated from a material selected from the group consisting essentially of cermet, indium oxide, tin oxide, nickel silicide, chromium silicide, molybdenum silicide and combinations thereof.

Atop the electrode, there is placed the upper, light receiving face of a light piping faceplate fabricated from a fused array of minute, oriented optical fibers. Each of the optical fibers from which said faceplate is fabricated is capable of transmitting the optical image incident upon the lower, image contacting, light incident face of the faceplate to the light receiving face thereof substantially without loss, i.e., with high resolution, efficiency, and low distortion. This optical characteristic provides for the fiber optic faceplate to transmit light incident thereupon in such a manner as to be the optical equivalent of a zero thickness window. The phenomenon of virtual loss-free transmission is accomplished due to the face that such fused fiber optic faceplates are characterized by the same type of "light-piping" properties typically displayed by individually clad optical fibers. The advantage of using such fiber optic faceplates in contact-type document scanners is that, due to the loss-free, light piping characteristics exhibited by said faceplate, it becomes possible to position the array of photosensitive elements at a somewhat distally removed location from the image being scanned, without loss of resolution or quality of image. Further, by providing a fairly thick faceplate, the array of photosensitive elements are separated a sufficient distance from the image bearing surface so that the build up of static electrical charges upon the image bearing surface will not destroy those photosensitive elements.

In those instances in which the array of photosensitive elements are deposited upon the substrate, an optical grease or an optical adhesive is disposed between those elements and the faceplate. The optical grease has an index of refraction which substantially matches the index of refraction of the optical fibers. Further, the optical grease has randomly interspersed therethroughout spherically-shaped, polystyrene beads about 0.001 to 0.01 inches in diameter. The beads are adapted to space the photosensitive elements an optimum distance from the image-bearing surface.

The semiconductor alloy material from which the photosensitive elements are fabricated is selected from the group consisting essentially of silicon, germanium, and combinations thereof and may further have one or more density of states reducing elements, such as hydrogen or fluorine, added thereto. The photosensitive elements are preferably deposited and utilized as p-i-n type photovoltaic diodes or photoresistors.

Preferably, associated with each of the photosensitive elements is an isolation photodiode or field effect transistor for facilitating the selective addressing and detection of the electrical photoconductivity of each of said photosensitive elements by the application of read potentials to respective pairs of address lines associated with each of said elements.

Also included as part of the instant disclosure is a source for projecting light onto the image bearing surface, said source operatively juxtaposed at a spaced distance from the light receiving face of the light piping faceplate and disposed on the side thereof opposite the image bearing surface. The light projecting source is adapted to transmit radiation through the interstitial segments of said array of photosensitive elements and said light piping faceplate, said interstitial segments defined by those surface areas of the transparent substrate not having photosensitive elements or isolation elements deposited thereupon. The light projection source is preferably adapted to project those wavelengths of light to which said array of photosensitive elements are responsive. The electrical signals photogenerated by said photosensitive elements in response to radiation incident upon each photosensitive element can thereafter be correlated to the image present on those small area portions of the image bearing surface adjacent each of the associated photosensitive elements.

DETAILED DESCRIPTION OF THE INVENTION

Figure 1:
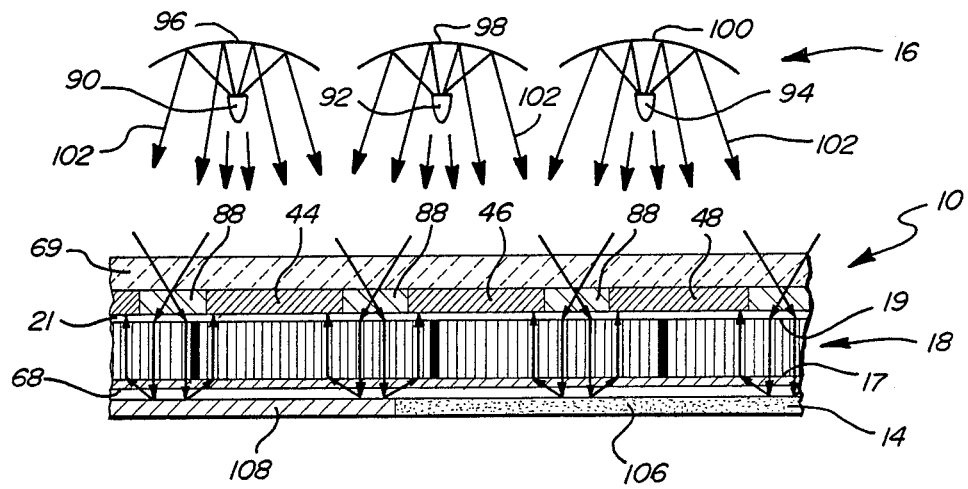
FIG. 1 is a partial cross-sectional side elevational view of the contact type, document scanning system of the instant invention; said image scanning system including a light piping substrate spacedly separated a predetermined distance from the array of photosensitive elements by a layer of optical grease.
Figure 2:
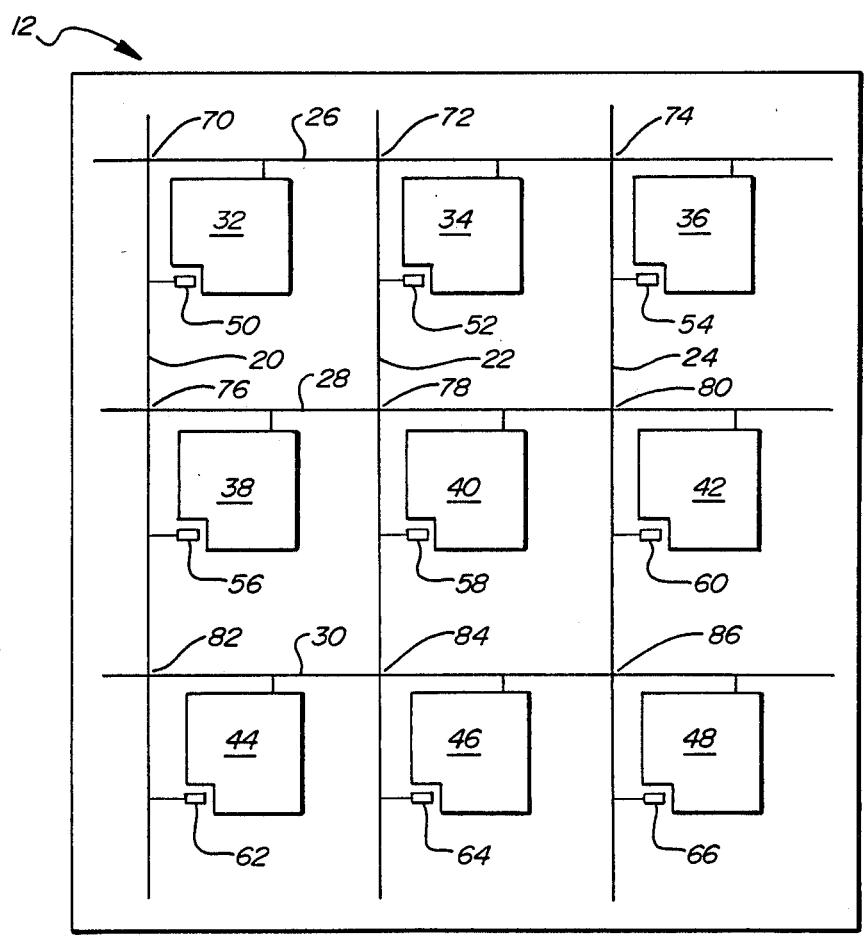
FIG. 2 is a somewhat stylistic top plan view of the contact type, document scanning system of the instant invention, as shown in FIG. 1, with the photosensitive elements and associated isolation elements thereof exposed.

FIGS. 1 and 2 illustrate a contact type, light piping document scanner system, generally designated by the reference numeral 10, said system embodying the concepts disclosed by the present invention. More specifically, the image scanning system 10 illustrated in FIG. 1 is generally adapted to photogenerate electrical signals representative of the detectable condition of an image on an image bearing surface, such as a document 14 disposed thereunder, and one or more light sources 16 disposed thereover.

The system 10 further includes a light piping faceplate 18 having spacedly opposed, relatively large area, substantially planar faces. The faceplate 18 is adapted to transmit radiation incident upon one of the faces 17 thereof through the small area, interstitial portions thereof (as defined hereinafter), with relatively little loss, to the opposed face 19 thereof; a first set of X address lines including address lines 20, 22 and 24; a second set of Y address lines including address lines 26, 28 and 30; and a plurality of photosensitive elements 32, 34, 36, 38, 40, 42, 44, 46 and 48. The system 10 further includes an isolation device 50, 52, 54, 56, 58, 60, 62, 64 and 66 operatively associated with each photosensitive element, and, if desired, a transparent, protective, abrasion resistant cover layer 68. Note that in most instances, this abrasion resistant layer 68 is not needed; however, such a layer can be employed to provide additional protection for heavy usage scanning applications.

The array of photosensitive elements are deposited atop of a relatively this glass substrate 69 which is also adapted to protect the photosensitive elements from the environment; while the lower cover layer 68, when employed, is operatively disposed below the light incident face 17 of the light piping faceplate 18 and is adapted to protect the image bearing surface 14 from abrasion due to any rough spots which might exist on the light incident surface 17 movingly engaging said image bearing surface. It is to be noted that a transparent substrate is employed in those instances wherein the source of illumination must pass through the image scanning system 10 in order to strike the image-bearing surface and be reflected back therefrom onto the array of photosensitive elements.

While the use of the light piping faceplate 18 of the instant invention operates to relax the tolerances which must otherwise be maintained between the array of photosensitive elements and the image-bearing surface, note that the discrete fibers from which said faceplate is fabricated are not lenses and therefore possess no focusing capabilities. Accordingly, it is important to maintain the image-bearing surface-to-array distance within certain limits (although those limits are not as demanding as was previously necessary). This is accomplished by (1) placing the light incident surface of the faceplate of the image scanning system 10 in direct contact with the image on the image-bearing surface and (2) maintaining the distance between the array of photosensitive elements and the fiber optic faceplate within predetermined values. The first of the aforementioned objectives is the essence of the field of "contact" imaging, is well known to those ordinarily skilled in the art and need not be further amplified upon herein.

The instant inventors have successfully met the second of the aforementioned objectives by placing a layer 21 of optical grease between the array of photosensitive elements and the faceplate. It is necessary to prevent externally applied pressure on the image scanning system 10 from comprising a portion of the layer of grease 21 so as to place the plane of the faceplate 18 in a non-parallel or skewed relationship relative to the plane of the array of photosensitive elements and to thereby bring portions of the image on the image-bearing surface 14 out of focus. The instant inventors have successively prevented to development of such a skewed, non-planar relationship of these planes by employing an optical grease in which spherically-shaped polystyrene beads are randomly dispersed. The optical grease currently utilized is in the silicone family, manufactured by Dow Corning, sold under the tradename of "Optical Couplant", was selected from Catalog No. Q2-3067 and lot number HH017370. As should be apparent, the polystyrene beads, being spherically shaped, serve as spacers which insure that a uniform distance is maintained. In a preferred embodiment, the polystyrene beads have a diameter of 0.002 inches, although the beads may be sized to provide about a 0.001 to 0.01 spacing between the array of photosensitive elements and the faceplate. The beads can be purchased from Cataphote, Inc., a division of Ferro Corporation in Jackson, Mo. under the tradename "UNI-SPHERES" from Catalog No. 270, Class 6. Also note that care should be taken to match the index of refraction of the optical grease to the index of refraction of the optical fibers. While the spacing beads provided a preferred embodiment, it is possible to alternatively utilize a transparent polyester shim (as manufactured by ICI Industries) to serve as the spacing member.

As can be appreciated from a perusal of FIG. 2, the X address lines 20, 22 and 24 and the Y address lines 26, 28 and 30 cross at an angle, and, as will be more apparent from the discussion which follows hereinafter, are spaced from one another to form a plurality of cross-over points 70, 72, 74, 76, 78, 80, 82, 84 and 86. Associated with each of the cross-over points is a respective one on the photosensitive elements. The photosensitive elements 32–48 are formed on one of opposed surfaces of the glass substrate 69 and are distributed thereover in spacedly disposed relationship to form a matrix of interstitial spaces 88 (see FIG. 1) between each of the contiguous pairs of the photosensitive elements. In this context, it is important that each of the photosensitive elements 32–48 are sized, configured and operatively disposed so as to ocupy only a fraction (the exact fraction dependent upon the strength of the light source) of the surface area of the transparent substrate 69 so that incident radiation from the light sources 90, 92 and 94 can pass therebetween and through the fiber optic faceplate 18 to illuminate the image on the bearing surface 14 disposed therebelow.

The array of photosensitive elements 32–48 are of the type which effect a detectable electrical characteristic in response to the receipt of light incident thereupon. As will be more fully described hereinafter, the photosensitive elements 32–48 can function as photovoltaic cells or photoconductors or photoresistors; as long as they effect a detectable change in electrical conductivity in response to the receipt of incident light thereupon. The photosensitive elements are preferably formed from a deposited thin film semiconductor alloy material, such as an amorphous silicon and/or an amorphous germanium semiconductor alloy material. Preferably the amorphous semiconductor alloy material includes (in addition to silicon) hydrogen and/or fluorine which are introduced to reduce the density of state present in the band gap of that material. Such alloys can be deposited by plasma assisted chemical vapor deposition, such as glow discharge, as disclosed for example in U.S. Pat. No. 4,226,898 which issued on Oct. 7, 1980 in the names of Stanford R. Ovshinsky and Arun Madan for "Amorphous Semiconductors Equivalent to Crystalline Semiconductors Produced by a Glow Discharge Process."

Each of the isolation devices 50–66 is associated with a respective one of the photosensitive elements 32–48. The isolation devices are also preferably formed from a deposited semiconductor alloy material, and most preferably from an amorphous silicon and/or germanium semiconductor alloy material. As mentioned hereinabove with respect to the photosensitive elements, the amorphous silicon alloy material from which isolation devices are fabricated can also include hydrogen and/or fluorine as density of states reducing materials, which materials can be deposited by plasma assisted chemical vapor deposition as disclosed in the aforementioned U.S. Patent. As can be noted from a perusal of FIG. 2, each of the isolation devices 50–66 is coupled in electrical series relation with an associated photosensitive element 32–48 between respective pairs of the X address lines 20, 22, and 24 and the Y address lines 26, 28, and 30 (although other types of multiplexing schemes may be employed without departing from the spirit or scope of the subject invention). As a result, the isolation devices 50–66 facilitate the selective addressing and hence the detection of the electrical conductivity of each of the photosensitive elements by the application of read potentials to respective pairs of the X and Y address lines.

Referring more particularly to FIG. 1, the light source, generally 16, comprises a plurality of individual, spacedly positioned light sources 90, 92 and 94. Associated with each of the sources 90, 92 and 94 is a hemispherically-shaped reflector 96, 98 and 100. The light sources 90, 92 and 94 and the respective reflectors 96, 98 and 100 are arranged to provide rays of uniform, diffused light, as indicated by the arrows 102; which rays of light are projected through the transparent substrate 69, the interstitial portions 88 of the array of light sensitive elements and through the light piping faceplate 18 onto the image bearing surface 14 to be scanned. The image bearing surface 14 is operatively disposed immediately adjacent to and adapted to be slidingly engaged by the light incident surface 17 of the faceplate 18. It is to be noted that in the preferred embodiment, the light incident surface 17 of the faceplate 18 is illustrated as being substantially planar; however, (and although not illustrated) said light incident surface 17 may in fact be non-planar as long as that non-planar surface substantially conforms to the contour of the image-bearing surface 14. Further, and as previously mentioned, the light incident surface 17 may include, on the image bearing surface-contacting side thereof, a protective coating layer 68 for preventing abrasion of the image bearing surface 14; said protective layer preferably formed on an oxide, nitride and/or carbide of silicon. The image bearing surface 14 includes at least one optically detectable, small area portion of high optical density 106, hereinafter referred to as the dark portion of the image bearing surface and at least one partially detectable, small area portion of low optical density 108, hereinafter referred to as the light portion of the image bearing surface.

The protective layer 68 (where applicable) is preferably relatively thin so that the image bearing surface 14 is closely spaced in juxtaposed relation to the light incident face 17 of the light piping faceplate 18. Either the cover layer 68, or the light incident face 17 (if no cover layer is employed), must be disposed in close proximity to the image bearing surface 14 so that light emanating from said image bearing surface 14 will strike said light incident face 17 without substantial attenuation. The key element which typifies this type of "proximity focusing" is a substantial one-to-one relationship between the size of the small area portion of the image on the image bearing surface 14 and the size of the corresponding photosensitive element in the array.

The light piping faceplate 18 is preferably a fiber optic faceplate composed of a fused array of minute (2-15 micrometers and preferably 6-8 micrometers in diameter), oriented, optical fibers adapted to transmit an optical image incident upon a small area portion of the light incident face 17 thereof to the light receiving face 19 thereof, with high resolution, a high degree of efficiency and little attenuation. Note that the faceplate is about 60-70% efficient in its transmission of illumination. The difference in efficiency of transmission, relative to that of the best quality fiber optics, is due to the fact that the circularly shaped fibers from which the faceplate is formed undergo a pressing operation in which those fibers become somewhat hexagonally-shaped. However, the transmission efficiency of 60-70% must still be compared to the 20-30% transmission efficiency of Selfoc lenses (which were previously employed). This factor of 2-3 times improvement is all the more impressive when it is realized that light makes two passes (an initial pass from the source and a second reflective pass from the image-bearing surface) through that faceplate (or through the Selfoc lens assembly). Therefore, and as can be readily appreciated, the factor of 4-6 times improvement results in greatly enhanced resolution when the reflected light finally reaches the array of photosensitive elements. As used herein, "oriented" refers to optical fibers wherein each distinct fiber maintains a substantially aligned, uniform position with respect to every other fiber.

The thickness of the light piping faceplate 18 is chosen to maximize the electrical isolation of the photosensitive elements from the static charge built up on the image bearing surface 14, while still providing for optimum transmission of the radiation transmitted from the light incident face 17 to the light receiving face 19. As mentioned hereinabove, the thickness of the faceplate 18 cannot be too large because the fibers merely transmit light without the percentage loss, vis-a-vis, Selfoc lenses, rather than focusing that light. The inventors hereof have advantageously employed a faceplate thickness of about 0.2 inches, although a thickness of 0.1 to 1 inch would be acceptable. The light receiving face 17 of said light piping substrate 18 should be substantially smooth; i.e., free from defects, irregularities and surface roughness which could mar or otherwise deleteriously effect the image bearing surface 14 against which it moves. Such a fiber optic faceplate is available and can be purchased from InCom Fiber Optics. The faceplate does not have a tradename, but is ordered to customer specification by giving the desired length, the width and the diameter of the fibers.

It may be necessary to etch, score or otherwise degrade the interstitial portions of said light incident face 17 of the faceplate 18 so as to facilitate the diffusion and scattering of radiation reflected thereonto from the image on the image bearing surface 14. The point to be considered when determining the extent to which the degrade the light incident face 17 is whether light transmitted through the discrete optical fibers of said light piping faceplate 18 is sufficiently spaced from the reflective surface of said image bearing surface 14 to angularly diffuse from the small area portions of the image bearing surface which it strikes and be received in adjacent optical fibers for transmission to a corresponding photosensitive element. Note that the light piping faceplate has 2 to 7% and preferably about 3% of the discrete optical fibers thereof formed from a blackened, 100% absorbing material randomly dispersed through the fused matrix of non-absorbing fibers. These blackened fibers are present in order to absorb "non-light piped" rays of light (i.e., light entering the fibers at an angle greater than the critical cone angle) which would otherwise contribute the optical cross-talk between adjacent fibers. This "extramural absorption (EMA)" is necessary to provide the optical system with high resolution capabilities.

Figure 3:
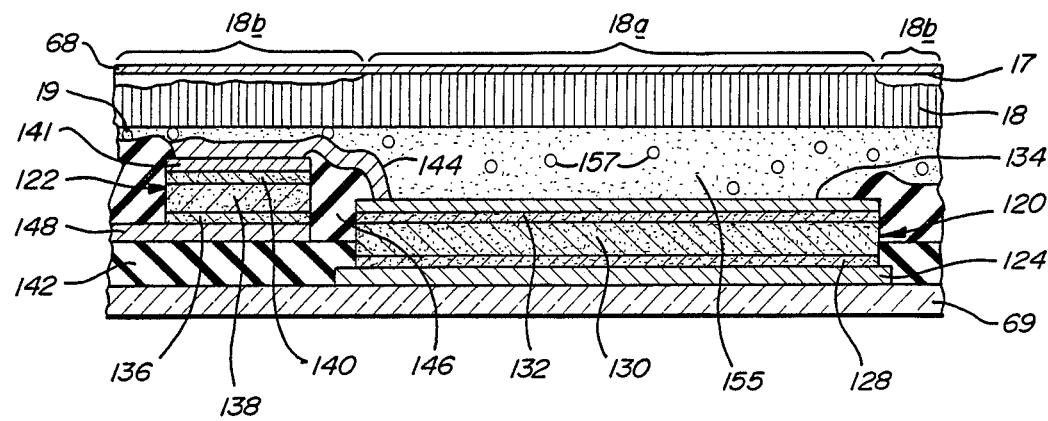
FIG. 3 is a partial cross-sectional side elevation view of a single photosensitive element and associated isolation element structured and operatively disposed immediately below the layer of optical grease and the light piping substrate, in accordance with a preferred embodiment of the present invention.
Figure 4:
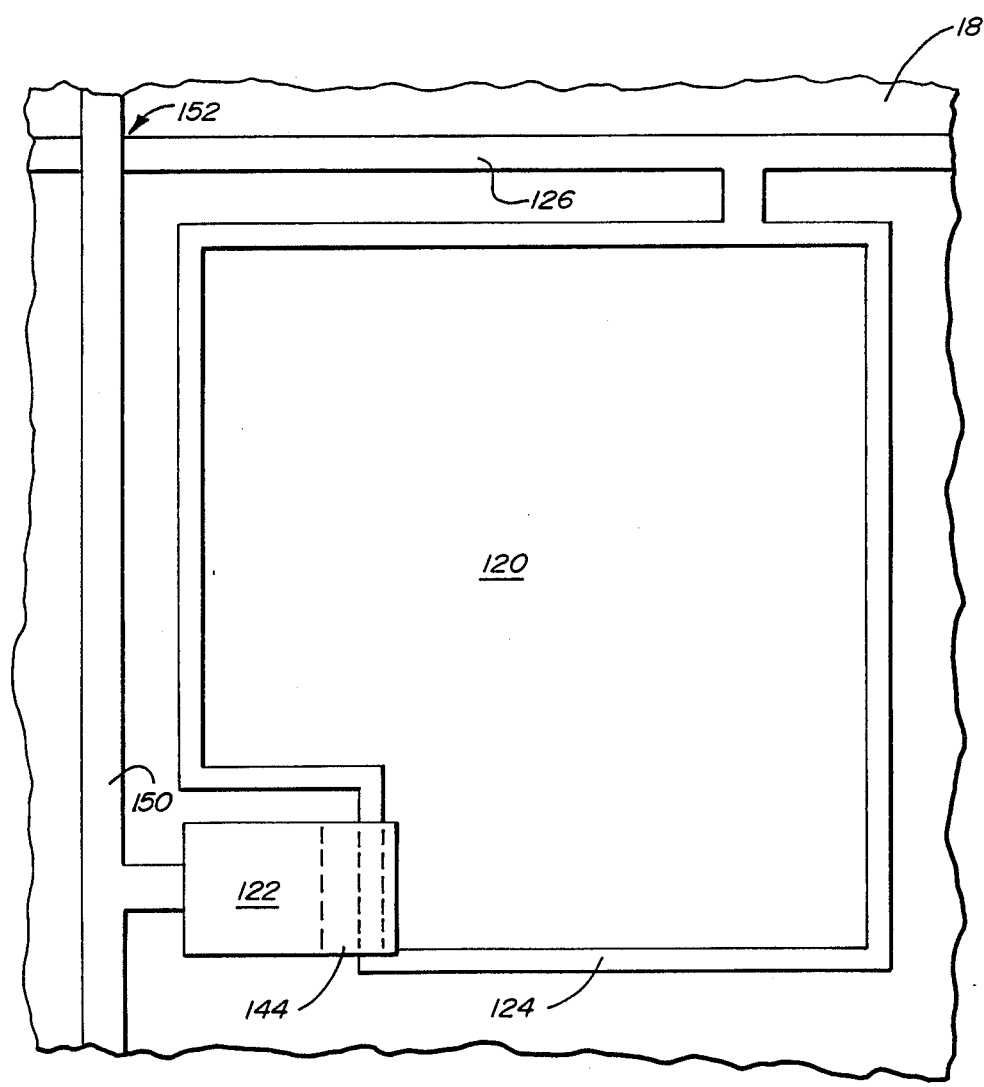
FIG. 4 is an enlarged top plan view of one of the photosensitive elements and an associated isolation element of the instant invention, as those elements are illustrated in FIG. 3.

Referring now to FIGS. 3 and 4, there is illustrative in greater detail a configuration of a single pixel formed by the combination of a single photosensitive element 120 and an isolation device 122, associated therewith and structured in accordance with the principles of the present invention. Here, the apparatus includes a transparent plastic or glass substrate 18, upon which substrate 18 there is formed an opaque metallic pad 124. The metallic pad 124 is electrically connected to a Y address line 126. The metallic pad 124 can be formed from, for example, a material selected from the group consisting essentially of aluminum, chromium, or molybdenum.

Formed atop the metallic pad 124 is the photosensitive element 120 which preferably takes the form of a photovoltaic cell. The photovoltaic cell or photosensitive element 120 preferably is fabricated to include an amorphous silicon or germanium alloy body fabricated by successively depositing a first doped layer 128 of silicon alloy material, an intrinsic layer 130 of silicon alloy material and a second doped layer 132 of silicon alloy material. The doped layers 128 and 132 are preferably opposite in conductivity so that the region 128 is p-type and the region 132 is n-type. Overlying the n-type layer 132 is an electrode layer 134 formed of a transparent, electrically conductive oxide material selected from the group consisting essentially of indium oxide, zinc oxide, tin oxide, and combinations thereof. The opaque metallic pad 124 is not only adapted to form an ohmic contact with the photosensitive element 120, but in addition, serves to block light from reaching the back side of that photosensitive element. This function of the metallic pad 124 is particularly important when the optical scanning system 10 is adapted to be used in accordance with the back reflective mode of operation illustrated in FIG. 1.

The isolation device, 122, fabricated in accordance with this embodiment, comprises a photodiode, also formed from an amorphous silicon or germainium alloy material fabricated through the successive deposition of a p-type layer 136 of silicon alloy material, an intrinsic layer 138 of silicon alloy material and an n-type layer 140 of silicon alloy material. The photodiode 122 is also formed on an opaque metallic pad 148 which is deposited atop a layer of an insulating material 142 fabricated from, for example, silicon oxide, silicon nitride or combinations thereof. Since the photodiode 122 and the photovoltaic cell 120 include the same layer composition and structure, it becomes possible to form isolation photodiode 122 during the same sequence of deposition operations as carried out in the formation of the photovoltaic cell 120. The upper electrode 141 of the isolation diode 122 is coupled to the upper electrode 134 of the photovoltaic cell 120 by an electrically conductive interconnect lead 144. Separating the photodiode 122 from the photovoltaic cell 120 is a deposited body of insulator material 146 which (as was true for layer 142)

can also be formed from silicon oxide, silicon nitride, silicon carbide, and combinations thereof.

The metallic pad 148 is electrically coupled to an X address line, such as line 150 (illustrated in FIG. 4). At the crossover points therebetween, the X address line 150 and the Y address line 126 are spaced apart by the insulating layer 142. Because the address lines cross at an angle and are separated from one another, insulated crossover points, such as crossover point 152, are thereby formed.

The light incident face 17 of the faceplate 18 is capable of diffusing light from non-shielded optical fibers onto associated small area portions of the image bearing surface, 104 and 106. It is to be noted that the discrete optical fibers 18 are adapted to extend perpendicularly between the light receiving face 19 and the light incident face 17 of said light piping faceplate 18. A plurality of those fibers 18a which underly at least the photosensitive element 120 of FIG. 3 have a smooth, substantially defect-free light incident, distal face. However, those fibers 18b underlying the interstitial segments of the light piping faceplate 18 (between adjacent photosensitive elements and isolation elements) have had the light incident face thereof degraded. In this manner, light from the source 16 which passes through the interstitial segments of the light piping faceplate 18 is diffused and does not reflect directly from the image bearing surface 14 adapted for operative disposition immediately therebelow and return along the same optical fiber from whence it emanated. Rather, those rays of light 102 (in FIG. 1) transmitted along optical fibers 18b angularly diffuse and are reflected to the light incident faces of adjacent optical fibers 18a for transmission to corresponding small area photosensitive elements. Again, however, it is to be noted that this is only required in those instances wherein the surface finish of the image bearing surface 14 is not sufficient to provide for the inherent diffusion of those rays of light. Finally, note that the light incident distal faces of optical fibers 18b can be degraded by simple lithographic etching techniques which are well known to those ordinarily skilled in the art. Depending upon the roughness of those faces 18b after the etching process, it may be necessary to deposit the aforementioned smooth protective cover layer 68 thereupon.

When the image bearing surface 14 is to be scanned, it is first placed in substantially close proximity to the optical image scanning system 10 and in substantially close proximity (and may even be in sliding contact) with the light incident face 17 of hte light piping faceplate 18. The light source 16 is then energized for projecting diffused rays of light 102 onto the glass substrate 68 operatively disposed atop the photosensitive elements for transmission through the interstitial spaces of said light piping faceplate 18 defined between said photosensitive elements. The rays of light which do not impinge upon the shielded upper electrode 124 and 148 of the photosensitive elements and the isolation elements, respectively, are transmitted through the light piping faceplate 18 for projection onto the image bearing surface 14 and for reflection therefrom onto the adjacent light incident face 17 of the light piping faceplate 18. On the dark portions 106 (see FIG. 1) of the image bearing surface 14, the rays of light 102 will be substantially absorbed so that very little of the light impinging thereupon will be reflected back through corresponding optical fibers of the light piping faceplate 18 so as to be received by the photosensitive elements deposited upon the light receiving face 19 thereof, for example, photosensitive elements 44 and 46.

However, rays of light striking light portions 108 of the image bearing surface 14 will not be substantially absorbed; therefore a considerably larger percentage of the light incident upon those light portions 108 will be reflected back through corresponding optical fibers of the light piping faceplate 18 so as to be received by corresponding photosensitive elements adjacent thereto, such as photosensitive element 48. The photosensitive elements adjacent and corresponding to the light portions 108 of the image bearing surface 14 will thereby affect a detectable change in the electrical conductivity thereof. When the photosensitive elements are formed from photovoltaic cells for operation in the fourth quadrant of their IV curve, the incident radiation will not only affect the change in electrical conductivity but will in fact photogenerate current to charge or discharge a preset threshold signal. If, however, the photosensitive elements are photoresistors adapted for third quadrant operation, radiation incident upon said photosensitive elements will affect an increase in electrical conductivity which can be detected by the application of read potentials to the respective pairs of the X address lines 20, 22 and 24 and the Y address lines 26, 28 and 30.

Electrical signals representing a faithful reproduction of the image bearing surface 14 can be obtained because the photosensitive elements 32–48 can be made very small (micron-scale). For example, the photosensitive elements can be made to have dimensions of no more than approximately 20 microns on a side and preferably 50 microns on a side. The isolation means 50–66 are formed to have dimensions of about 10 to 40 microns on a side and preferably 20 microns on a side. Also, the photosensitive elements 32–40 are spaced apart so that they cover only a certain portion of the light receiving face 19 of the light piping faceplate 18 to permit rays of light 102 to be projected therebetween and through the interstitial segments of the substrate 18 and to be diffused onto the image on the image bearing surface 14 to be scanned. For example, the photosensitive elements may be spacedly disposed so as to cover only about 20 to 80 percent of the overall surface area of the light receiving face 19 of the light piping faceplate 18, thereby providing a substantial pathway for the rays of light 102.

It is informative to note that the photosensitive elements can be arranged in substantially co-planar relationship so that each will be equally spaced from iamge bearing surface 14 to be scanned; though it is also important to realize for the purpose of the present invention, that it is not necessary that said photosensitive elements be spaced equidistantly from the image bearing surface for proximity focusing of said image bearing surface 14 relative thereto. Rather, it is only necessary that the light incident face 17 of the light piping faceplate 18 be located proximate said image bearing surface 14. This is because the optical fibers of the light piping faceplate 18 are capable of transmitting light between the distal faces thereof without loss. Therefore, as long as the small area portions of the light incident face 17 receives light from corresponding small area portions of image bearing surface 14, that light will be faithfully transmitted to the light receiving face 19 and the photoresponsive element associated therewith. It is further important to note that although FIG. 2 illustrates a 3×3 matrix of photosensitive elements, said matrix is merely illustrative and a much larger array of elements would actually be required for 3 dimensional scanning. However, a movable linear array of photosensitive elements, such as a lxn matrix could be utilized to movably scan the image on said image bearing surface 14. Again, it is because the typical length of line imaging sensors are about eight inches that it becomes necessary to deposit the amorphous silicon layers on a glass substrate and only subsequently cover the amorphous silicon layers with a plurality of smaller, light piping faceplates.

The electrical characteristics, and, in accordance with this preferred embodiment, the electrical conductivity of the photosensitive elements can be detected by applying read potentials to respective pairs of the X and Y address lines in series and one at a time. However, and most preferably, the photosensitive elements can be divided into groups of elements and the read potentials can be applied to each group of elements in parallel to facilitate a more rapid scanning of the image bearing surface 14. Within each group of photosensitive elements, the elements can be scanned in series.

Figure 5:
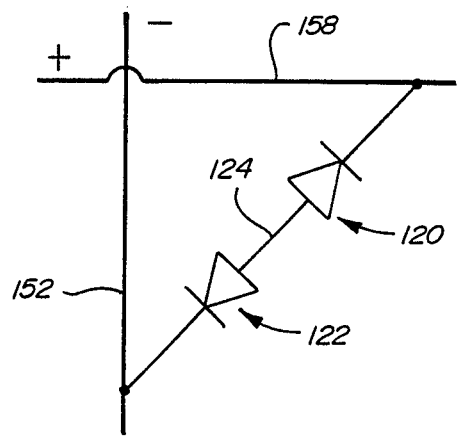
FIG. 5 is the equivalent circuit diagram of the photosensitive element and isolating element of FIG. 3, as those elements are operatively connected to the address lines of the x-y matrix.

Referring now to FIG. 5, there is illustrated the equivalent circuit diagram of the photosensitive element 120 and the isolation element 122. Due to the fact that the isolation element 122 and the photosensitive element 120 are formed on a common conductive pad 124, the anode of the isolation diode 122 and the photosensitive element 120 are electrically coupled together in anode to anode relationship. The cathode of the photosensitive element 120 is electrically coupled to the Y address line 158 and the cathode of the isolation diode 122 is electrically coupled to the X address line 152. In order to read the condition of the photosensitive element 120, a negative potential is applied to the X address line 152 and a positive potential is applied to the Y address line 158 to forward bias the isolation diode 122. If light is reflected off of a light (low density) small area portion of the image on the image bearing surface 14 and onto the corresponding photosensitive element 120, a current will be photogenerated by said photosensitive element and will be detected through the forward biased isolation diode 122. However, if the small area photosensitive element is operatively disposed so as to receive light from an associated dark (high density) small area portion of the image bearing surface 14, substantially no light will be reflected from and be incident upon the photosensitive element and hence substantially no current will be photogenerated by said photosensitive element. The difference between the two levels of photogenerated current can therefore is contrasted for deriving an electrical signal representative of the small area image portions corresponding to each of the photosensitive elements.

It should be understood that the present invention is not limited to the precise structure illustrated in the described embodiments. It is intended rather that foregoing descriptions of the presently preferred embodiments be regarded as illustrative rather than as a limitation of the present invention. It is therefore the following claims, including all equivalents, which define the scope of the instant invention. Thus, it is possible to effect minor changes to the embodiments of the present invention without departing from the spirit or scope of the invention.

We claim:

1. Image scanning apparatus adapted to photogenerate electrical representative of a detectable condition of an image-bearing surface; said apparatus comprising:

a light-piping faceplate having spacedly opposed relatively large area faces, said faceplate adapted to transmit radiation from small segments of an image-bearing surface and incident on corresponding small area segments of the light incident face of the faceplate operatively positioned proximate thereto, with relatively little loss, onto the corresponding small area segments of the spacedly opposed, light receiving face of said faceplates;

a large area array of spacedly disposed, small area thin film photosensitive elements spacedly disposed relative to said light receiving face of said light piping faceplate, each of said elements aligned with and adapted to photogenerate an electrical signal substantially corresponding in intensity to the amount of light transmitted by corresponding small area segments of said light-receiving face;

means for selectively addressing each discrete photosensitive element of the large area array of sensing the photogenerated signal; and means interposed between the light incident face of said faceplate and the photosensitive elements for maintaining a preselected spacing therebetween; said spacing means is an optical grease means which includes spacing members interspersed therewithin, said optical grease means having an index of refraction which substantially corresponds to the index of refraction of said light-piping faceplate.

2. Apparatus as in claim 1, wherein said light piping faceplate is formed from a fused array of individually clad optical fibers.

3. Apparatus as in claim 1, wherein said spacing members are spherical polystrene beads.

4. Apparatus as in claim 3, wherein said beads are sized to provide a 0.001–0.01 inch spacing between the photosensitive elements and said faceplate.

5. Apparatus as in claim 2, wherein each of the photosensitive elements is about 400–10,000 square micrometers.

6. Apparatus as in claim 5, wherein each optical fiber of said faceplate is about 3–20 micrometers in diameter, whereby about 20–300 fibers communicate with each photosensitive element of the array.

7. Apparatus as in claim 1, wherein said light incident face of said faceplate is adapted to contact an image-bearing surface associated therewith.

8. Apparatus as in claim 7, further including a hard protective covering overlying said light incident face.

9. Apparatus as in claim 1, wherein the thickness of said fiber optic faceplate is about 0.1 to 1.0 inch.

10. Apparatus as in claim 1, wherein the thickness of said fiber optic faceplate is about 0.2 inches.

11. Apparatus as in claim 1, further including a substrate upon which the array of photosensitive elements is deposited.

12. Apparatus as in claim 11, wherein the substrate is transparent.

13. Apparatus as in claim 1, wherein said photosensitive elements are formed from contiguous layers of deposited semiconductor alloy material.

14. Apparatus as in claim 1, wherein said layers of semiconductor alloy material include an amorphous silicon alloy material.

15. Apparatus as in claim 14, wherein said amorphous silicon alloy material further includes at least one density of states reducing element selected from the group consisting essentially of hydrogen, fluorine, and combinations thereof.

16. Apparatus as in claim 1, wherein said photosensitive elements comprise p-i-n-type photodiodes.

17. Image scanning apparatus adapted to photogenerate electrical signals representative of a detectable condition of an image-bearing surface; said apparatus comprising:
- a light-piping faceplate having spacedly opposed relatively large area faces, said faceplate adapted to transmit radiation from small area segments of an image-bearing surface and incident on corresponding small area segments of the light incident face of the faceplate operatively positioned proximate thereto, with relatively little loss, onto the corresponding small area segments of the spacedly opposed, light receiving face of said faceplate;
- a large area array of spacedly disposed, small area thin film p-i-n type photovoltaic cells including a transparent electrically conductive upper electrode spacedly disposed relative to said light receiving face of said light piping faceplate, each of said calls aligned with and adapted to photogenerate an electrical signal substantially corresponding in intensity to the amount of light transmitted by corresponding in intensity to the amount of light transmitted by corresponding small area segments of said light-receiving face;
- means for selectively addressing each discrete cell of the large area array for sensing the photogenerated signal, said addressing means including isolation means associated with each cell; and
- a light shielding layer of opaque electrically conductive material deposited on the surface of both the isolation means and the photosensitive cells opposite said light piping faceplate; said shielding layer further providing an address lead connecting said isolation means to a first plurality of address lines and connecting said photosensitive cells to a second plurality of address lines, said second lines electrically insulated from said first lines.

18. Apparatus as in claim 17, further including a light source adapted to project light through said image scanning apparatus onto an image bearing surface operatively disposed therebelow; said light source positioned above the light incident face of said light piping faceplate.

19. Apparatus as in claim 18 wherein said light shielded isolation elements and said light shielded photosensitive elements are spacedly disposed in a substantially horizontal plane so as to provide for radiation from said light source to pass vertically therebetween and illuminate an image bearing surface disposed therebeneath.

20. Apparatus as in claim 19, wherein the number and size of spacedly disposed photosensitive elements and isolation elements provide sufficient unshielded interstitial area to provide for the transmission therebetween of about 20–80 percent of radiation from said light source.

21. Apparatus as in claim 17, wherein said layer of transparent, electrically conductive material is selected from the group consisting essentially of transparent cermets, nickel silicide, chromium silicide, molybdenum silicide, conductive oxides, and combinations thereof.

22. Apparatus as in claim 17, wherein said opaque shielding layer is formed of a material selected from the group consisting essentially of aluminum, chromium, molybdenum, nickel, and combinations thereof.

23. Image scanning apparatus adapted to photogenerate electrical signals representative of a detectable condition of an image-bearing surface; said apparatus comprising:
- a light-piping faceplate formed of a pressed array of individually clad optical fibers and having spacedly opposed relatively large area faces; said faceplate adapted to transmit radiation from small area segments of an image-bearing surface and incident on corresponding small area segments of the light incident face of the faceplate operatively positioned proximate thereto, with relatively little loss, onto the corresponding small area segments of the spacedly opposed, light-receiving face of said faceplate;
- a large area array of spacedly disposed, small area thin film photosensitive elements spacedly disposed relative to said light receiving face of said light piping faceplate, each of said elements aligned with and adapted to photogenerate an electrical signal substantially corresponding in intensity to the amount of light transmitted by corresponding small area segments of said light-receiving face;
- means for selectively addressing each discrete photosensitive element of the large area array for sensing the photogenerated signal; and
- said light-piping faceplate including a plurality of strongly absorbing optical fibers dispersed in the array for reducing communication between adjacent fibers.

24. Apparatus as in claim 23, wherein the strongly absorbing fibers account for about 2–7% of the total number of fibers in the faceplate.

* * * * *